United States Patent [19]

O'Brien et al.

[11] 4,125,777
[45] Nov. 14, 1978

[54] RADIATION EMITTER-DETECTOR PACKAGE

[75] Inventors: James T. O'Brien, Leola; Albert C. Limm, Lancaster; Paul Nyul, New Holland; Vincent S. Tassia, Jr., York, all of Pa.

[73] Assignee: RCA Corporation, New York, N.Y.

[21] Appl. No.: 825,473

[22] Filed: Aug. 17, 1977

[51] Int. Cl.² ............................................. G02B 27/00
[52] U.S. Cl. .................................... 250/551; 250/239; 357/19
[58] Field of Search ............. 357/19; 250/205, 213 A, 250/551, 239

[56] References Cited

U.S. PATENT DOCUMENTS

| 3,822,384 | 7/1974 | Chapron | 250/239 |
| 3,893,158 | 7/1975 | Lincoln | 357/19 |

*Primary Examiner*—David C. Nelms
*Attorney, Agent, or Firm*—H. Christoffersen; B. E. Morris

[57] ABSTRACT

Mounted on the metallic base member of a radiation emitter-detector package is a mounting block having a first projection, and a second projection spaced from the first projection. A radiation detector is on the first projection and a semiconductor electroluminescent device, i.e., a radiation emitter, is on the second projection such that the plane of the recombination region of the electroluminescent device is substantially perpendicular to the radiation incident surface of the radiation detector. The electroluminescent device is of the type having a primary emission and a secondary emission in a direction different from the primary emission. A radiation emitter-detector package as described is ideally suited to those applications wherein the secondary radiation of the electroluminescent device is fed into a feedback circuit regulating the biasing current of the electroluminescent device.

6 Claims, 3 Drawing Figures

RADIATION EMITTER-DETECTOR PACKAGE

BACKGROUND OF THE INVENTION

The present invention relates to a radiation emitter-detector package and more specifically to such a package suitable for being used in the feedback circuit regulating the radiation emitter current source.

Semiconductor electroluminescent devices, i.e., radiation emitters, emit electromagnetic radiation as a result of the recombination of carriers of opposite charge. The emitted radiation may be either visible or invisible. Electroluminescent devices include devices such as lasers and light emitting diodes (LED's).

A problem plaguing those in the field of electroluminescent devices is the ability to linearize the output and/or stabilize the optical operating bias of the electroluminescent device. A solution for correcting this problem is monitoring the secondary emission of electroluminescent devices and feeding the electrical signal of such secondary emission into a feedback circuit which controls the circuit element driving the electroluminescent device. However, to implement this circuitry it would be most desirable if there was a radiation emitter-detector package which could readily be utilized in such a feedback circuit.

SUMMARY OF THE INVENTION

A radiation emitter-detector package includes a metallic base member having opposed flat surfaces. On one surface of the metallic base member is a means for mounting a semiconductor electroluminescent device of the type having a primary radiation emission in one direction and a secondary radiation emission in a different direction, and a radiation detector having a radiation incident surface in the optical path of the secondary emission of the electroluminescent device. Furthermore, the means electrically contacts the electroluminescent device to the radiation detector.

DETAILED DESCRIPTION OF THE INVENTION

Figure 1:
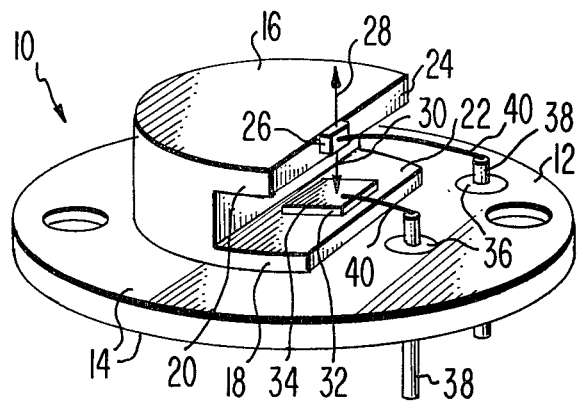
FIG. 1 is a perspective view of the radiation emitter-detector package of the present invention.

Referring to FIG. 1, the radiation emitter-detector package of the present invention is designated as 10. The radiation emitter-detector package 10 includes a metallic base member 12 having opposed flat surfaces 14. Preferably, the metallic base member 12 is of a material having good thermal conductivity. Materials suitable for the metallic base member 12 are for example, copper or an iron-cobalt-nickel alloy sold under the tradename Kovar which consists of 29% nickel, 17% cobalt, and the balance iron.

On a surface 14 of the metallic base member 12 is a means for mounting a semiconductor electroluminescent device of the type having a primary radiation emission in one direction and secondary radiation emission in an different direction, and a radiation detector having a radiation incident surface such that the radiation incident surface is in the optical path of the secondary radiation emission of the electroluminescent device. The mounting means also electrically contacts the electroluminescent device to the radiation detector. By way of example, the mounting means may include a mounting block 16 having a first projection 18 and a second projection 20 spaced from said first projection 18. The first and second projections 18 and 20 are, for example, flat and plate-like in form. The first projection 18 is in contact with a surface 14 of the metallic base member 12. The first projection 18 includes a first flat surface 22 spaced from the metallic base member 12. The second projection 20 has a second flat surface 24 which is typically in a plane substantially perpendicular to and intersecting the first flat surface 22. A consequence of such a geometric relationship between the first and second flat surfaces 22 and 24 is that the first projection 18 extends farther in an outwardly direction from the center of the mounting block 16 than the second projection 20.

On the first flat surface 22 is a semiconductor radiation detector 32 having a radiation incident surface 34. On the second flat surface 24 is a semiconductor electroluminescent device 26 capable of a primary radiation emission in one direction, i.e., from one emitting surface, and a secondary radiation emission in an opposite direction, i.e., emission from an opposite emitting surface. The direction of the primary emission is depicted by arrow 28 and the direction of the secondary emission in depicted by arrow 30. The radiation detector 32 and electroluminescent device 26 are on their respective surfaces so that the plane of the recombination region of the device 26 is substantially perpendicular to the radiation incident surface 34, and further so that the secondary emission impinges the radiation incident surface 34. It is well known to those skilled in the electroluminescent device art that the recombination region is that portion of the electroluminescent device where oppositely charged carriers recombine to generate electroluminescence.

The first and second flat surfaces 22 and 24 have been described as having a perpendicular geometric relation to each other. However, such a relationship is not necessary in carrying out the present invention. Of importance in the present invention is that the plane of the recombination region of the electroluminescent device 26 be substantially perpendicular to the radiation incident surface 34 of the radiation detector 32.

For the purpose of describing the package 10 of the present invention, the mounting block 16 electrically contacts the anode of the electroluminescent device 26 to the cathode of the radiation detector 32. However, it is well understood by those skilled in the art that the mounting block 16 can electrically contact either polarity of the electroluminescent device 26 to either polarity of the radiation detector 32.

Semiconductor electroluminescent devices meeting the emission requirements of device 26 include, for example, RCA Corporation's, "CW-Operated Aluminum Gallium Arsenide Injection Lasers C30127" and "C30126" and "High Radiance, High Spped Edge Emitting IR Diode C30123".

It is of course understood that the radiation detector 34 must be optically sensitive to the frequency of the secondary emission of the electroluminescent device 26. The particular elctroluminescent devices described above emit radiation having a wavelength in the range of 8,000 to 9,000 agnstroms. A radiation detector 34 sensitive to radiation of such a frequency range is, for example, RCA Corporation's "Silicon Photodiode C30808".

While one function of the mounting block 16 is that of a support, another function of the mounting block 16 is as an electrical contact between the anode of the electroluminescent device 26 and the cathode of the radiation detector 32. It is also desirable if the mounting block 16 functions as a heat sink for the electroluminescent device 26 and radiation detector 32. Typically, a metal such as copper is suitable for handling the supportive, electrical conductive and heat sink functions of the mounting block 16.

The mounting block 16 is also in electrical contact with the metallic base member 12 on which it is mounted.

The radiation emitter-detector package 10 further includes means for electrically contacting the elctroluminescent device 26 and radiation detector 32 to external circuitry. These electrically contacting means may include a pair of electrically insulating sleeves 36 extending through the metallic base member 12, with a pair of electrically conducting terminals 38 extending through the pair of insulating sleeves 36 so as to electrically insulate the terminals 38 from the metallic base member 12. A pair of wire leads 40 respectively contact the electroluminescent device 26 and radiation detector 32 to the terminals 38. The insulating sleeves 36 may be of a glass material such as borosilicate glass, the terminals 38 can be of a material such as Kovar, while the wire leads will usually be of gold.

Figure 2:
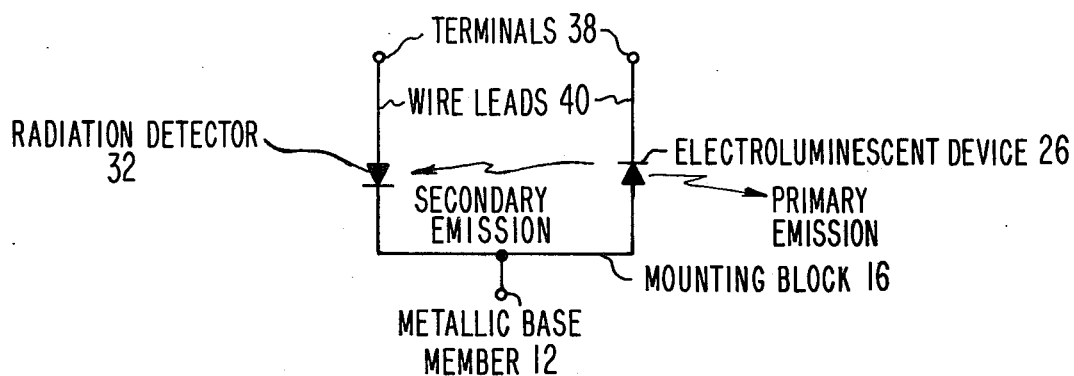
FIG. 2 is an electrical schematic of the radiation emitter-detector package of FIG. 1.

The equivalent electrical circuit of the radiation emitter-detector package 10 of the present invention is shown as a schematic diagram in FIG. 2. The anode of the electroluminescent device 26 and cathode of the radiation detector 32 are in electrical contact through the mounting blocks 16 which is in electrical contact to the metallic base member 12. Electrical contact of the electroluminescent device 26 and radiation detector 32 to external circuitry is made by way of the terminals 38.

Typically, the radiation emitter-detector package 10 is part of a feedback circuit wherein the secondary emission of the electroluminescent device 26 causes a signal to flow in the feedback circuit which is used to control the circuit element driving the electroluminescent device 26. The purpose of such circuitry, to which the package 10 is ideally suited, is to linearize output and/or stabilize the optical operating bias in the presence of a modulating signal to the electroluminescent device 26. For the radiation emitter-detector package 10 to function properly as part of a feedback circuit, the primary and secondary emission must be proportionally related. Usually in semiconductor lasers the primary and secondary emission has a ratio of 1:1.

Figure 3:
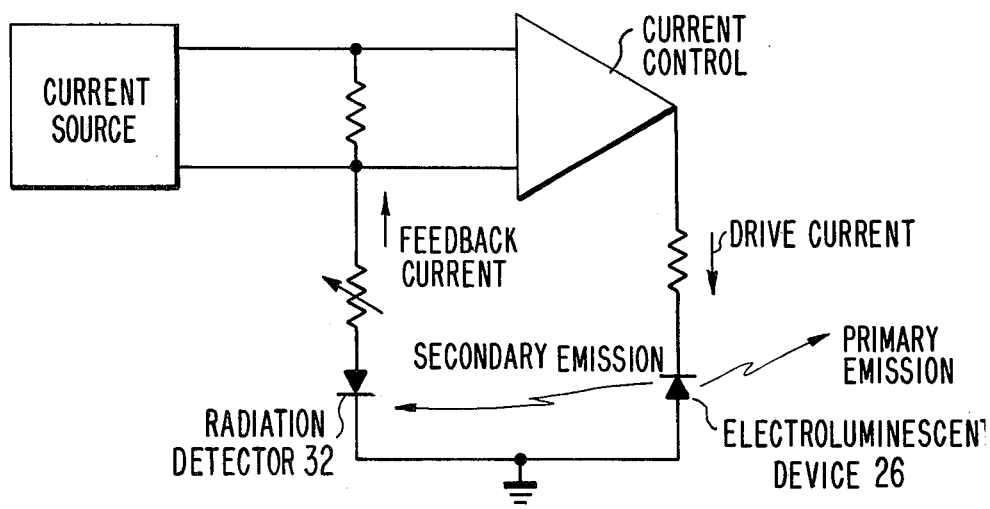
FIG. 3 is an electrical schematic of the radiation emitter-detector package of FIG. 1 in a typical feedback circuit.

A schematic of a typical feedback circuit including the radiation emitter-detector package 10 is shown in FIG. 3.

The metallic base member 12 is shown in FIG. 1 having two openings therein. It is well understood that the purpose of these holes is for securing the package 10 to mounting elements such as a circuit board.

In the fabrication of the radiation emitter-detector package 10, the metallic base member 12 is formed by conventional milling techniques and the insulating sleeves 36 and terminals 38 are set into the metallic base member 12 by conventional techniques. The mounting block 16 may be made by conventional milling techniques and is mounted on the metallic base member 12 by soldering. The radiation detector 32 and laser 26 are respectively mounted on the first and second projections 18 and 20 by soldering. The leads 40 are connected to the terminal pair 38 and the radiation detector device 32 and electroluminescent device 26 by conventional soldering techniques. While it is not shown in FIG. 1, typically a cap is secured to the metallic base member 12 covering the mounting block 16. However, the top of the cap will be of a transparent material so that the primary emission of the electroluminescent device 26 can be emitted therethrough or a fiber optic could extend through the top of the cap for transmitting the primary emission.

The primary and secondary emission of the electroluminescent devide 26 have been described as being in an opposite direction, i.e., about 180° apart. However, the present invention anticipates that the primary and secondary emission need only be in different directions, not necessarily 180° part, to accomplish the purpose of the present invention.

The radiation emitter-detector package 10 of the present invention is ideally suited for use in a feedback circuit wherein the secondary emission of an electroluminescent device is monitored for the purpose of controlling the current source of the electroluminescent device.

We claim:

1. A radiation emitter-detector package comprising:
   a metallic base member having opposed flat surfaces; and
   means for mounting a semiconductor electroluminescent device of the type having a primary emission in one direction and a secondary radiation emission in a different direction, and a radiation detector having a radiation incident surface in the optical path of the secondary emission of said electroluminescent device, said means electrically contacting said electroluminescent device to said radiation detector, said means being on one surface of said metallic base member.

2. The radiation emitter-detector package in accordance with claim 1 wherein said primary and secondary emission are in the opposite direction.

3. The radiation emitter-detector package in accordance with claim 1 wherein said means comprises:
   a mounting block having a first porjection and a second projection spaced from said first projection, said first projection in contact with said metallic base member, said radiation detector being on said first projection and said electroluminescent device being on said second projection such that the plane of the recombination region of said electroluminescent device is substantially perpendicular to the radiation incident surface of said radiation detector.

4. The radiation emitter-detector package in accordance with claim 3 wherein said mounting block is thermally conductive.

5. The radiation emitter-detector package in accordance with claim 4 further comprising means for electrically contacting said electroluminescent device and radiation detector to external circuitry.

6. The radiation emitter-detector package in accordance with claim 5 wherein said means comprises:
   a pair of electrically insulating sleeves extending through said metallic base member;
   a pair of electrically conducting terminals extending through said pair of insulating sleeves so as to electrically insulate said terminals from said base member; and
   a pair of leads electrically contacting said electroluminescent device and radiation detector to said terminals respectively.

* * * * *

Disclaimer 4,125,777.—*James T. O'Brien*, Leola; *Albert C. Limm*, Lancaster; *Paul Nyul*, New Holland and *Vincent S. Tassia, Jr.*, York, PA. RADIATION EMITTER-DETECTOR PACKAGE. Patent dated Nov. 14, 1978. Disclaimer filed June 22, 1982, by the assignee, *RCA Corp.*

Hereby enters this disclaimer to all claims of said patent.

[*Official Gazette October 26, 1982.*]